US012562356B2

(12) United States Patent
Brown et al.

(10) Patent No.: US 12,562,356 B2
(45) Date of Patent: Feb. 24, 2026

(54) LINEAR ARRANGEMENT FOR SUBSTRATE PROCESSING TOOLS

(71) Applicant: LAM RESEARCH CORPORATION, Fremont, CA (US)

(72) Inventors: Danny Arthur Brown, Pleasanton, CA (US); Brian Mwenze Bradley, San Francisco, CA (US); Marissa Elena Ortiz, San Jose, CA (US); Michael C. Kellogg, Oakland, CA (US); Emil Nenov, Sunnyvale, CA (US); Kevin Luong, San Jose, CA (US); Christopher J. Pena, Hayward, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 649 days.

(21) Appl. No.: 17/908,414

(22) PCT Filed: Mar. 1, 2021

(86) PCT No.: PCT/US2021/020186
    § 371 (c)(1),
    (2) Date: Aug. 31, 2022

(87) PCT Pub. No.: WO2021/178266
    PCT Pub. Date: Sep. 10, 2021

(65) Prior Publication Data
    US 2023/0085987 A1    Mar. 23, 2023

Related U.S. Application Data

(60) Provisional application No. 62/983,829, filed on Mar. 2, 2020.

(51) Int. Cl.
    *H01J 37/32*    (2006.01)

(52) U.S. Cl.
    CPC .... *H01J 37/32899* (2013.01); *H01J 37/3244* (2013.01); *H01J 37/32807* (2013.01);
    (Continued)

(58) Field of Classification Search
    CPC ............ H01J 37/32899; H01J 37/3244; H01J 37/32807; H01J 37/3288; H01J 37/32908; H01J 2237/334
    See application file for complete search history.

(56) References Cited

U.S. PATENT DOCUMENTS

| | | | |
|---|---|---|---|
| 1,004,663 A | 10/1911 | Landrum | |
| 9,929,028 B2 | 3/2018 | Trussell et al. | |

(Continued)

FOREIGN PATENT DOCUMENTS

| | | | |
|---|---|---|---|
| JP | 2011103463 A | 5/2011 | |
| JP | 2018110198 A | 7/2018 | |

(Continued)

OTHER PUBLICATIONS

International Search Report and Written Opinion of the ISA issued in PCT/US2021/020186, mailed Jun. 30, 2021; ISA/KR.

(Continued)

*Primary Examiner* — Yuechuan Yu

(57) ABSTRACT

A substrate processing system includes a vacuum transfer module and a plurality of process modules defining respective processing chambers. The plurality of process modules includes a first row of the process modules arranged on a first side of the vacuum transfer module and a second row of the process modules arranged on a second side of the vacuum transfer module opposite the first side. Each of the plurality of process modules includes a gas box arranged above the process module and configured to selectively supply at least one gas and/or gas mixture into the processing chamber of the process module and a radio frequency (Continued)

(RF) generator configured to generate RF power to create plasma within the processing chamber. The RF generator is arranged above the process module and the gas box and the RF generator are arranged side-by-side above the process module.

17 Claims, 8 Drawing Sheets

(52) U.S. Cl.
CPC .... *H01J 37/3288* (2013.01); *H01J 37/32908* (2013.01); *H01J 2237/334* (2013.01)

(56) References Cited

U.S. PATENT DOCUMENTS

| | | | |
|---|---|---|---|
| 2003/0236587 A1 | 12/2003 | Ono | |
| 2009/0301392 A1* | 12/2009 | Kobayashi | C23C 16/4401 |
| | | | 118/50 |
| 2013/0230370 A1 | 9/2013 | Hoey et al. | |
| 2014/0180469 A1 | 6/2014 | Flitsch | |
| 2015/0380217 A1 | 12/2015 | Rocha-Alvarez et al. | |
| 2018/0076075 A1* | 3/2018 | Janakiraman | H01L 21/6776 |
| 2018/0144908 A1 | 5/2018 | Yanai et al. | |
| 2019/0267219 A1* | 8/2019 | Uemura | H01J 37/32834 |
| 2020/0083071 A1 | 3/2020 | Gould et al. | |

FOREIGN PATENT DOCUMENTS

| | | | |
|---|---|---|---|
| JP | 2018174210 A | 11/2018 |
| KR | 20110052462 A | 5/2011 |
| KR | 1020150131064 A | 11/2015 |
| KR | 1020170054241 A | 5/2017 |
| KR | 20180029907 A | 3/2018 |
| TW | 201948006 A | 12/2019 |

OTHER PUBLICATIONS

Japanese Office Action for Japanese Application No. 2022-552524 mailed Feb. 4, 2025.
Korean Office Action for Korean Application No. 10-2022-7034214 dated Dec. 18, 2024.
Taiwanese Office Action for Taiwanese Application No. 110107288 dated Dec. 18, 2024.

* cited by examiner

324

326

Outside of Substrate
Processing Tool

Inside of Substrate
Processing Tool

304

324

326

304

400

424

412

416

408-2

408-1

420

404

LINEAR ARRANGEMENT FOR SUBSTRATE PROCESSING TOOLS

CROSS-REFERENCE TO RELATED APPLICATIONS

This application is a U.S. National Phase Application under 35 U.S.C. 371 of International Application No. PCT/US2021/020186, filed on Mar. 1, 2021, which claims the benefit of U.S. Provisional Application No. 62/983,829, filed on Mar. 2, 2020. The entire disclosures of the applications referenced above are incorporated herein by reference.

FIELD

The present disclosure relates to substrate processing tool architecture, and more particularly to a linear arrangement for substrate processing tools.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A substrate processing system may be used to perform deposition, etching and/or other treatment of substrates such as semiconductor wafers. During processing, a substrate is arranged on a substrate support in a processing chamber of the substrate processing system. Gas mixtures including one or more precursors are introduced into the processing chamber and plasma may be struck to activate chemical reactions.

The substrate processing system may include a plurality of substrate processing tools arranged within a fabrication room. Each of the substrate processing tools may include a plurality of process modules or chambers. Substrates are transferred into a substrate processing tool through one or more intermediate chambers, such as front opening unified pods (FOUPs), an equipment front end module (EFEM), and/or load locks. The substrates are transferred between process modules within a vacuum transfer module (VTM).

SUMMARY

A substrate processing system includes a vacuum transfer module and a plurality of process modules defining respective processing chambers. The plurality of process modules includes a first row of the process modules arranged on a first side of the vacuum transfer module and a second row of the process modules arranged on a second side of the vacuum transfer module opposite the first side. Each of the plurality of process modules includes a gas box arranged above the process module and configured to selectively supply at least one gas and/or gas mixture into the processing chamber of the process module and a radio frequency (RF) generator configured to generate RF power to create plasma within the processing chamber. The RF generator is arranged above the process module and the gas box and the RF generator are arranged side-by-side above the process module.

In other features, the substrate processing system has a linear axis, the first and second rows of the process modules are parallel to and arranged on opposite sides of the linear axis, and the gas box is arranged inward of the RF generator relative to a linear axis of the substrate processing system. The RF generator is arranged inward of the gas box relative to a linear axis of the substrate processing system. The process module has a vertical column footprint defined by an outer perimeter of the process module and outer perimeters of the gas box and the RF generator do not exceed the vertical column footprint of the process module.

In other features, the first row of the process modules is configured to perform a first process and the second row of the process modules is configured to perform a second process. The first process is a dielectric etch process and the second process is a conductive etch process. The first row of the process modules is configured to perform the first process independently of the second row of the process modules performing the second process.

In other features, the substrate processing system further includes a power distribution assembly configured to supply power to the first row of the process modules and the second row of the process modules. The power distribution assembly is configured to supply power to the first row of the process modules independently of supplying power to the second row of the process modules. The power distribution assembly is arranged on a third side of the vacuum transfer module between the first side and the second side. The substrate processing system further includes a lock-out/tag-out (LOTO) assembly arranged on the third side of the vacuum transfer module. The substrate processing system further includes an equipment front end module (EFEM) arranged on a fourth side of the vacuum transfer module opposite the third side.

In other features, the substrate processing system further includes a first facility gas interface box configured to distribute gases to the first row of the process modules and a second facility gas interface box configured to distribute gases to the second row of the process modules. The first facility gas interface box is configured to distribute gases to the first row of the process modules independently of the second facility gas interface box distributing gases to the second row of the process modules.

In other features, the first row of the process modules includes five of the process modules and the second row of the process modules includes five of the process modules. Each of the first row and the second row includes two hoists configured to lift and lower respective top plates of at least three of the process modules. Each of the two hoists is configured to lift and lower the respective top plate of a center one of the five process modules. Each of the process modules includes a slide and pivot assembly configured to rotate a bias assembly of the process module away from the processing chamber.

A substrate processing system includes a process module defining a processing chamber. The process module is configured to perform at least one process on a substrate arranged within the processing chamber. A gas box configured to selectively supply at least one gas and/or gas mixture into the processing chamber of the process module. The gas box is arranged above the process module. A radio frequency (RF) generator is configured to generate RF power to create plasma within the processing chamber. The RF generator is arranged above the process module.

In other features, the gas box and the RF generator are arranged side-by-side above the process module. The gas box is arranged inward of the RF generator relative to a linear axis of the substrate processing system. The RF generator is arranged inward of the gas box relative to a linear axis of the substrate processing system. The gas box is arranged above the RF generator. The RF generator is arranged above the gas box. The process module has a vertical column footprint defined by an outer perimeter of the process module and outer perimeters of the gas box and the RF generator do not exceed the vertical column footprint of the process module.

In other features, the substrate processing system further includes a plurality of the process modules in a linear arrangement. The plurality of the process modules includes a first row of the process modules and a second row of the process modules. The first row of the process modules is configured to perform a first process and the second row of the process modules is configured to perform a second process. The first process is a dielectric etch process and the second process is a conductive etch process. The first row of the process modules is configured to perform the first process independently of the second row of the process modules performing the second process.

In other features, the substrate processing system further includes a power distribution assembly configured to supply power to the first row of the process modules and the second row of the process modules. The power distribution assembly is configured to supply power to the first row of the process modules independently of supplying power to the second row of the process modules. The first row of the process modules is arranged on a first side of the substrate processing system, the second row of the process modules is arranged on a second side of the substrate processing system opposite the first side, and the power distribution assembly is arranged on a third side of the substrate processing system between the first side and the second side.

In other features, the substrate processing system further includes a lock-out/tag-out (LOTO) assembly arranged on the third side of the substrate processing system. The substrate processing system further includes an equipment front end module (EFEM) arranged on a fourth side of the substrate processing system opposite the third side. The substrate processing system further includes a first facility gas interface box configured to distribute gases to the first row of the process modules and a second facility gas interface box configured to distribute gases to the second row of the process modules. The first facility gas interface box is configured to distribute gases to the first row of the process modules independently of the second facility gas interface box distributing gases to the second row of the process modules.

In other features, the first row of the process modules includes five of the process modules and the second row of the process modules includes five of the process modules. Each of the first row and the second row includes two hoists configured to lift and lower respective top plates of at least three of the process modules. Each of the two hoists is configured to lift and lower the respective top plate of a center one of the five process modules. The process module includes a slide and pivot assembly configured to rotate a bias assembly of the process module away from the processing chamber.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

The number of substrate processing tools within a fabrication room may be constrained by the dimensions and respective configurations of the substrate processing tools. Tool density refers to a number of substrate processing tools and/or process modules per unit area of a fabrication room. The configurations of the substrate processing tools define a tool footprint, spacing, and/or pitch, which define a tool density of the fabrication room. Systems and methods according to the principles of the present disclosure provide a substrate processing tool configuration that maximizes substrate processing tool density and accessibility.

Figures 1, 2A, 2B:
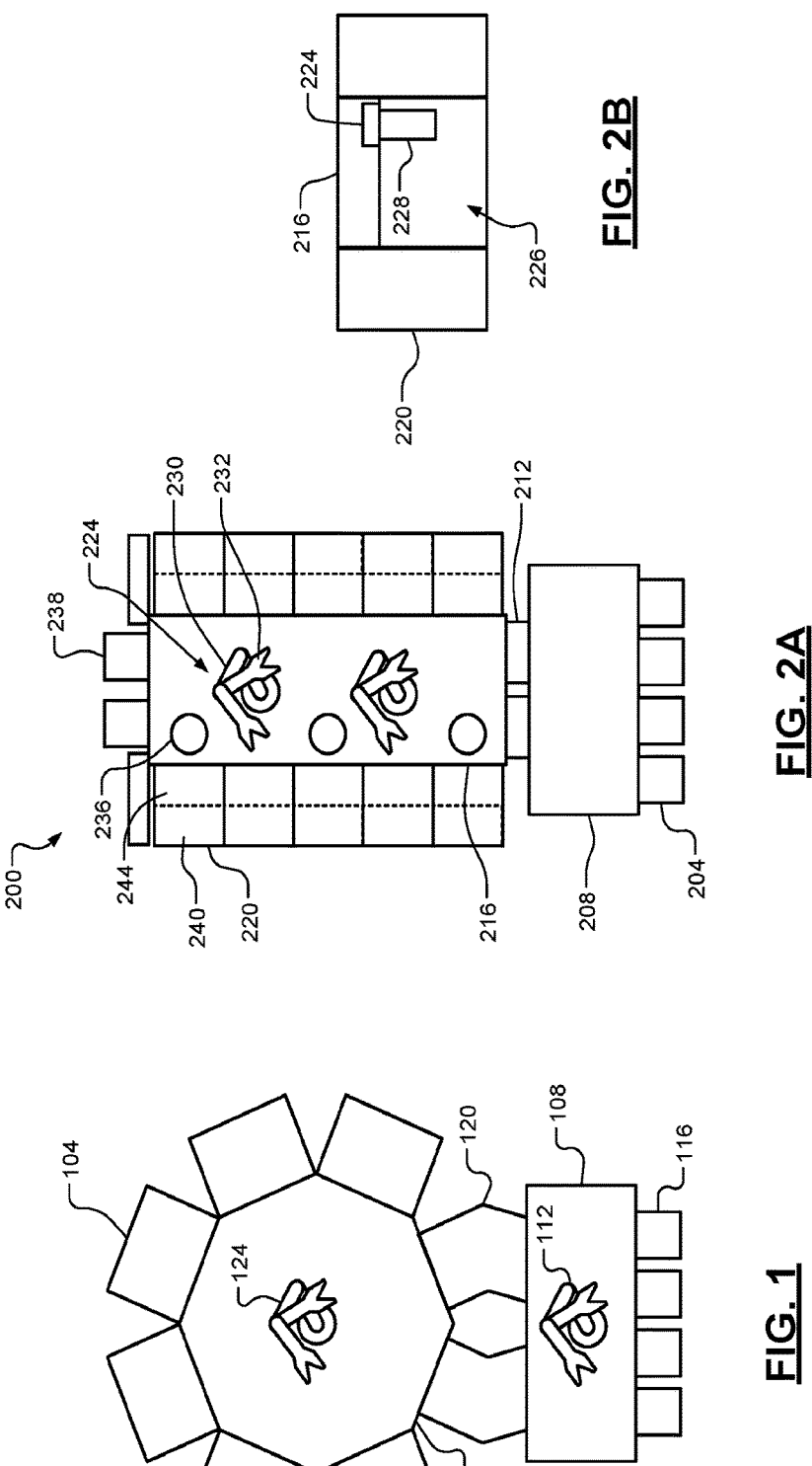
FIG. 1 is an example substrate processing tool.
FIG. 2A is a plan view of an example substrate processing tool according to the present disclosure.
FIG. 2B is an example end view of the substrate processing tool of FIG. 2A according to the present disclosure.

Referring now to FIG. 1, a top-down view of an example substrate processing tool 100 is shown. The substrate processing tool 100 includes a plurality of process modules 104. For example only, each of the process modules 104 may be configured to perform one or more respective processes on a substrate. Substrates to be processed are loaded into the substrate processing tool 100 via ports of a loading station of an atmosphere-to-vacuum (ATV) transfer module, such as an equipment front end module (EFEM) 108, and then transferred into one or more of the process modules 104. For example, a transfer robot 112 is arranged to transfer substrates from loading stations 116 to airlocks, or load locks, 120, and a robot 124 of a vacuum transfer module 128 is arranged to transfer substrates from the load locks 120 to the various process modules 104.

In the example shown in FIG. 1, the substrate processing tool 100 has a circular arrangement. Accordingly, the process modules 104 are arranged azimuthally around the VTM 128. A quantity, as well respective positions, of the substrate processing tools 100 within a fabrication room may be limited by the circular arrangement shown in FIG. 1. A fabrication room may include a plurality of the substrate processing tools 100 arranged in parallel rows and columns or in a staggered or offset arrangement. Further, a number of the process modules 104 per each one of the substrate processing tools 100 and accessibility of components of the substrate processing tools 100 (e.g., for service, repair, replacement, etc.) including the process modules 104 may be limited by this configuration.

FIG. 2A shows a plan view of an example configuration of a substrate processing tool 200 according to the principles of the present disclosure. Each of the processing tools 200 includes loading stations 204, an equipment front end module (EFEM) 208, load locks 212, and a vacuum transfer module (VTM) 216 arranged in a linear configuration. For example only, the loading stations 204 may correspond to front opening unified pods (FOUPs). In some examples, the load locks 212 may be fully or partially integrated within the EFEM 208. In other examples, the load locks 212 are arranged outside of and adjacent to the EFEM 208. An example linear configuration including load locks 212 that are at least partially located within the EFEM 208 is described in Patent Cooperation Treaty Application No. PCT/US2018/022397, filed on Mar. 14, 2018, the entire contents of which are incorporated by reference herein.

The tool 200 includes 2N process modules 220 in a linear arrangement in two parallel rows adjacent to and offset from the VTM 216, where N is an integer. In FIG. 2A, N=5, although other configurations of the tool 200 may include N=1 to 4 or N=5 of the process modules 220. For example, a length of the VTM 216 may be extended or shortened to accommodate additional or fewer process modules 220, respectively. The process modules 220 may include substrate processing chambers configured to perform etching on substrates, such as dielectric etching (e.g., inductively coupled plasma (ICP) etching), capacitive etching (e.g., capacitively coupled plasma (CCP) etching), and/or other substrate treatments. In some examples, each row of the process modules 220 may be configured to operate asymmetrically. In other words, the process modules 220 in one of the rows may be configured to operate independently of the process modules 220 in the other of the rows and/or independently of others of the process modules 220 in the same row.

Similarly, the VTM 216 may include one or more robots 224 having various configurations. For example, the tool 200 includes M robots 224 aligned with a center lengthwise axis (i.e., a center line) of the VTM 216, where M is an integer. For example, as shown, M=2, although more or fewer robots 224 may be used. In other examples, one or more of the robots 224 may be arranged off-center (i.e. shifted to the right and/or left toward the process modules 220 on one or both sides) relative to the center line of the VTM 216. In other words, primary pivot axes of the robots 224 may be off-center.

For example, as shown in an end view of the substrate processing tool 200 in FIG. 2B, a service tunnel 226 may be defined below the VTM 216. Portions 228 of the robots 224 including associated circuitry and mechanical components (e.g., motors, power supplies, etc.) extend downward from the robots 224 into the service tunnel 226 in locations aligned with pivot axes of the robots 224. When the robots 224 are aligned with the center line of the VTM 216, the downward-extending portions 228 restrict access to the service tunnel 226. Conversely, in the example shown in FIG. 2B, the robots 224 are shifted to a side of the VTM 216 (i.e., are offset from the center line of the VTM 216) to facilitate access to the service tunnel 226.

Although shown having one arm 230, each of the robots 224 may have configurations including one, two, or more of the arms 230. In some examples, the robots 224 may include one or two end effectors 232 on each of the arms 230.

The substrate processing tool 200 may include one or more storage buffers 236. The storage buffers 236 are configured to store one or more substrates between processing stages, before or after processing, etc., and/or to store edge rings, covers, and other components of the process modules 220. As shown, one or more strip modules 238 may be arranged on an end of the VTM 216 opposite the loading stations 204. In other examples, one or more of the storage buffers 236, additional process modules, post-processing modules, and/or other components may be arranged on the end of the VTM 216 opposite the loading stations 204. In some examples, one or more of the EFEM 208, the load locks 212, the VTM 216, and the process modules 220 may have a vertically stacked configuration. For example, each of the process modules 220 may correspond to two process modules 220 in a vertically stacked configuration (i.e., one process module 220 arranged above/below the other), the VTM 216 may correspond to two VTMs 216 in the vertically stacked configuration, each of the load locks 212 may correspond to two load locks 212 in the vertically stacked configuration, and each of the loading stations 204 may correspond to two loading stations 204 in the vertically stacked configuration.

Each of the process modules 220 includes associated internal and external components (not shown) including, but not limited to, radio frequency (RF) generator and power supply circuitry and gas delivery system components. For example, each of the process modules 220 includes an RF generator 240 and a gas box 244 (e.g., including components such as one or more manifolds, valves, flow controllers, etc.). In the substrate processing tool 200 according to the present disclosure, the RF generator 240 and the gas box 244 are arranged above the process module 220. As shown in FIG. 2A, the RF generator 240 and the gas box 244 are arranged side-by-side above the process module 220. In some examples, the RF generator 240 is arranged closer to the VTM 216 than the gas box 244 (i.e., inward of the gas box 244 relative to the service tunnel 226) and the gas box 244 is arranged outward of the RF generator 240. In other examples, the gas box 244 is arranged closer to the VTM 216 than the RF generator 240 (i.e., inward of the RF generator 240 relative to the service tunnel 226) and the RF generator 240 is arranged outward of the gas box 244. In other examples, the RF generator 240 and the gas box 244 may be arranged in a stacked configuration (i.e., one on top of the other) above the process module 220. In other examples, one of the RF generator 240 and the gas box 244 may be arranged above the process module 220 while the other of the RF generator 240 and the gas box 244 is arranged below the process module 220.

In some examples of the above configurations, each of the RF generator 240 and the gas box 244 may be arranged within a footprint (e.g., a vertical column footprint) of the process module 220. In other words, in these examples, outer perimeters of the RF generator 240 and the gas box 244 do not exceed an outer perimeter of the process module 220. In other examples, one or both of the RF generator 240 and the gas box 244 may extend beyond the footprint of the process module 220.

For example, the tool 200 includes M robots 224 aligned with a center lengthwise axis (i.e., a center line) of the VTM 216, where M is an integer. For example, as shown, M=2, although more or fewer robots 224 may be used. In other examples, one or more of the robots 224 may be arranged off-center (i.e. shifted to the right and/or left toward the process modules 220 on one or both sides) relative to the center line of the VTM 216.

Figure 3A:
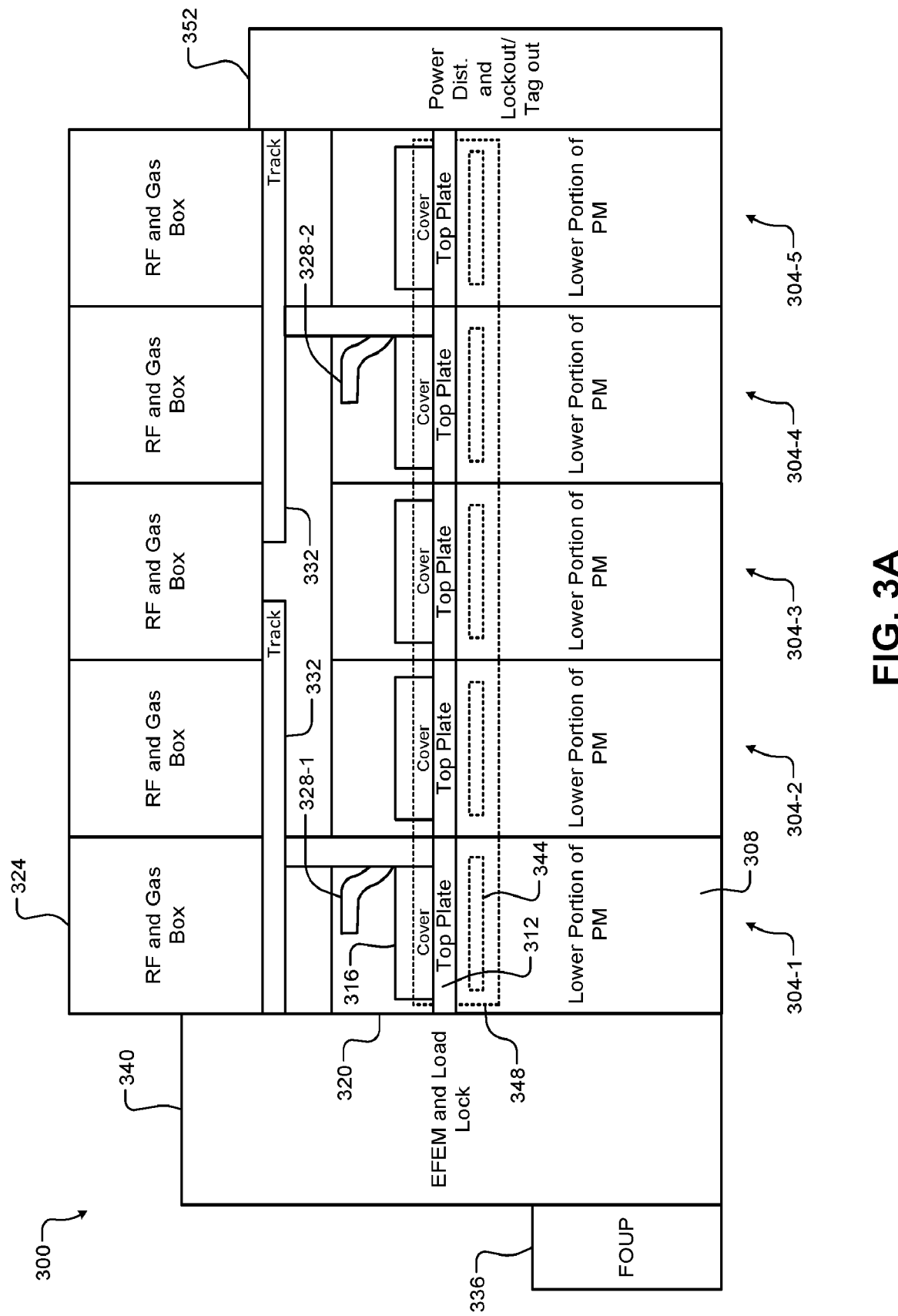
FIG. 3A is a side view of an example substrate processing tool according to the present disclosure.
Figure 3B:
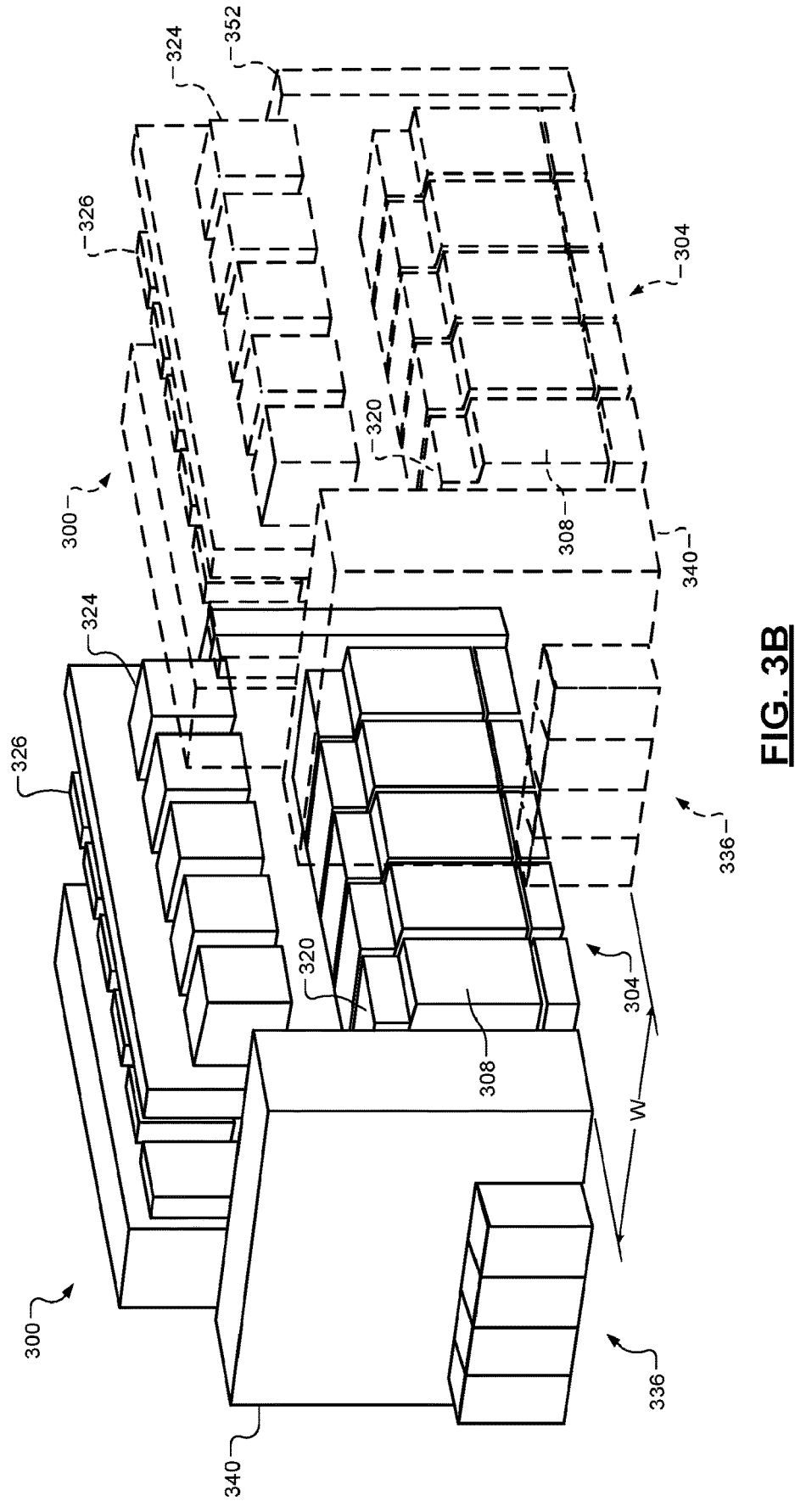
FIG. 3B is a perspective view of portions of two example substrate processing tools according to the present disclosure.

FIG. 3A shows a side view and FIG. 3B shows an isometric view of a substrate processing tool 300 comprising process modules 304 arranged in two parallel rows (e.g., parallel, coplanar rows) and portions of two of the substrate processing tools 300 (one in solid lines and the other in dashed lines) disposed side-by-side (in FIG. 3B) in a single fabrication laboratory. In the views of FIGS. 3A and 3B, only one (e.g., front) row of the process modules 304 is shown while a back row is not visible.

The process modules 304 include a first process module 304-1, a second process module 304-2, a third process module 304-3, a fourth process module 304-4, and a fifth process module 304-5, referred to collectively as the process modules 304. Each of the process modules 304 includes a respective lower portion (e.g., enclosing a processing volume) 308, a top plate 312, a cover 316 for the top plate 312, and a connection assembly 320 arranged on the top plate 312. For example, the assembly 320 includes fluid and electrical connections. Collectively, the top plate 312 and the assembly 320 may be referred to as a top plate assembly. An RF generator 324 and gas box 326 are arranged above respective ones of the process modules 304 and supply RF power and process gases to the process modules 304.

Each of the process modules 304 alone or in combination may be referred to as a substrate processing system. Each of the process modules 304 may be used to etch substrates using, for example, radio frequency (RF) plasma. Each process module 304 includes a processing chamber, such as an inductive coupled plasma (ICP) chamber or a capacitively coupled plasma (CCP) chamber. The stations may, for example, perform conductive etch, dielectric etch, and/or other substrate treatment. In some examples, one of the rows of process modules 304 may be configured to perform conductive etch while the other of the rows of process modules 304 is configured to perform dielectric etch. In other examples, the process modules 304 in each of the rows may be configured to receive and operate in accordance with different supply voltages. For example, the process modules 304 in one of the rows may be configured to receive a relatively lower voltage (e.g., 200-300 volts) while the process modules 304 in the other of the rows may be configured to receive a relatively higher voltage (e.g., 375-600 volts).

Each row of the substrate processing tool 300 includes a plurality of hoists 328 (shown in more detail in FIG. 5) including, for example, a first hoist 328-1 and a second hoist 328-2. Each of the hoists 328 moves vertically and laterally along a respective track 332. The first hoist 328-1 is configured to lift and lower the top plate assemblies of the process modules 304-1, 304-2, and 304-3 and/or other components. Conversely, the second hoist 328-2 is configured to lift and lower the top plate assemblies of the process modules 304-3, 304-4, and 404-5 and/or other components. In other words, each of the hoists 328 is arranged to interact with pairs of the process modules 304 on respective ends of the row while both of the hoists 328 is arranged to interact with the middle process module 304-3. In this manner, the hoists 328 are configured to allow multiple (e.g., up to four) operators using respective hoists 328 in both rows of the substrate processing tool 300 to lift and lower respective top plate assemblies at a same time.

Substrates scheduled to be loaded into (or transported from) the substrate processing tool 300 are stored in loading stations 336. Substrates are loaded into the substrate processing tool 300 via an EFEM and load lock assembly 340 and then transferred into the process modules 304 via respective loading ports 344 of a VTM 348. Power distribution and lock-out/tag-out (LOTO) assemblies 352 distribute power to various components of the substrate processing tool 300 and provide LOTO functions.

As shown in FIG. 3B, there is limited space between adjacent ones of the substrate processing tools 300. As an example, a width W of an aisle between the substrate processing tools 300 may be 1030 mm. This provides a minimal amount of space to open processing chambers of the process modules 304 and obtain access to the process modules 304 and interiors of corresponding processing chambers.

Typically, power distribution and/or LOTO assemblies for the process modules 304 are arranged adjacent to respective ones of the process modules 304. In other words, the power distribution and LOTO assemblies are arranged on sides of the substrate processing tools 300 facing the aisles between adjacent ones of the substrate processing tools 300. In this arrangement, greater clearance space is required in the aisles between the adjacent ones of the substrate processing tools 300 to accommodate LOTO assemblies and associated protocols. As shown in FIGS. 3A and 3B, the power distribution and LOTO assemblies 352 according to the present disclosure are located on a back end of the substrate processing tool 300 (i.e., an end of the substrate processing tool 300 opposite the loading stations 336).

Figures 3C, 3D:
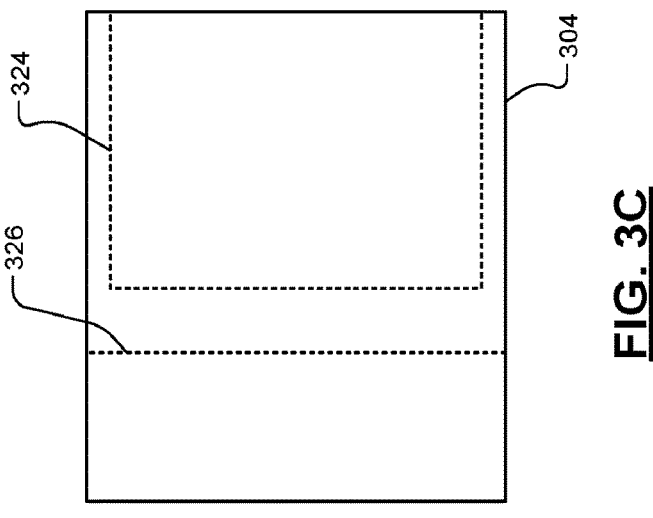
FIGS. 3C and 3D illustrate an example radio frequency generator module and gas box arranged within a footprint of a process module according to the present disclosure.

FIGS. 3C and 3D show a top-down view and an isometric view, respectively, of the RF generator 324 and the gas box 326 arranged above the process module 304. In these examples, each of the RF generator 324 and the gas box 326 is arranged within a footprint (e.g., a vertical column footprint) of the process module 304. In other words, outer perimeters of the RF generator 324 and the gas box 326 do not exceed an outer perimeter of the process module 304. In other examples, one or both of the RF generator 324 and the gas box 326 may extend beyond the footprint of the process module 304. For example, the gas box 326 may extend partially beyond the footprint of the process module 304 or may be located completely inward (i.e., relative to an outer perimeter of the substrate processing tool 300) of the process module 304.

As shown, the RF generator 324 and the gas box 326 are arranged side-by-side above the process module 304 with the gas box 326 arranged inward (i.e., relative to an outer perimeter of the substrate processing tool 300) of the RF generator 324. In other examples, the RF generator 324 may be arranged inward of the gas box 326.

Typically, accessing the PM 304 for servicing and maintenance may be difficult. For example, it may be difficult to reach over and above the PM 304 to access components of the PM 304 (e.g., the top plate 312, the cover 316, the connection assembly 320, etc.) and/or other components of the substrate processing tool 300 arranged above and/or behind the PM 304. Arranging the RF generator 324 and the gas box 326 above the PM 304 according to the configuration of the present disclosure allows the PM 304 to be arranged near a bottom portion of the substrate processing tool 300 (e.g., on PM frame arranged directly on or near a floor of the fabrication room). Accordingly, the arrangement of the RF generator 324 and the gas box 326 above the PM 304 facilitates service and maintenance access.

Although shown in a side-by-side configuration above the process module 304, in other examples the RF generator 324 and the gas box 326 may be arranged in a stacked configuration (i.e., one on top of the other) above or below the process module 304. In other examples, one of the RF generator 324 and the gas box 326 may be arranged above the process module 304 while the other of the RF generator 324 and the gas box 326 is arranged below the process module 304.

Figure 3F:
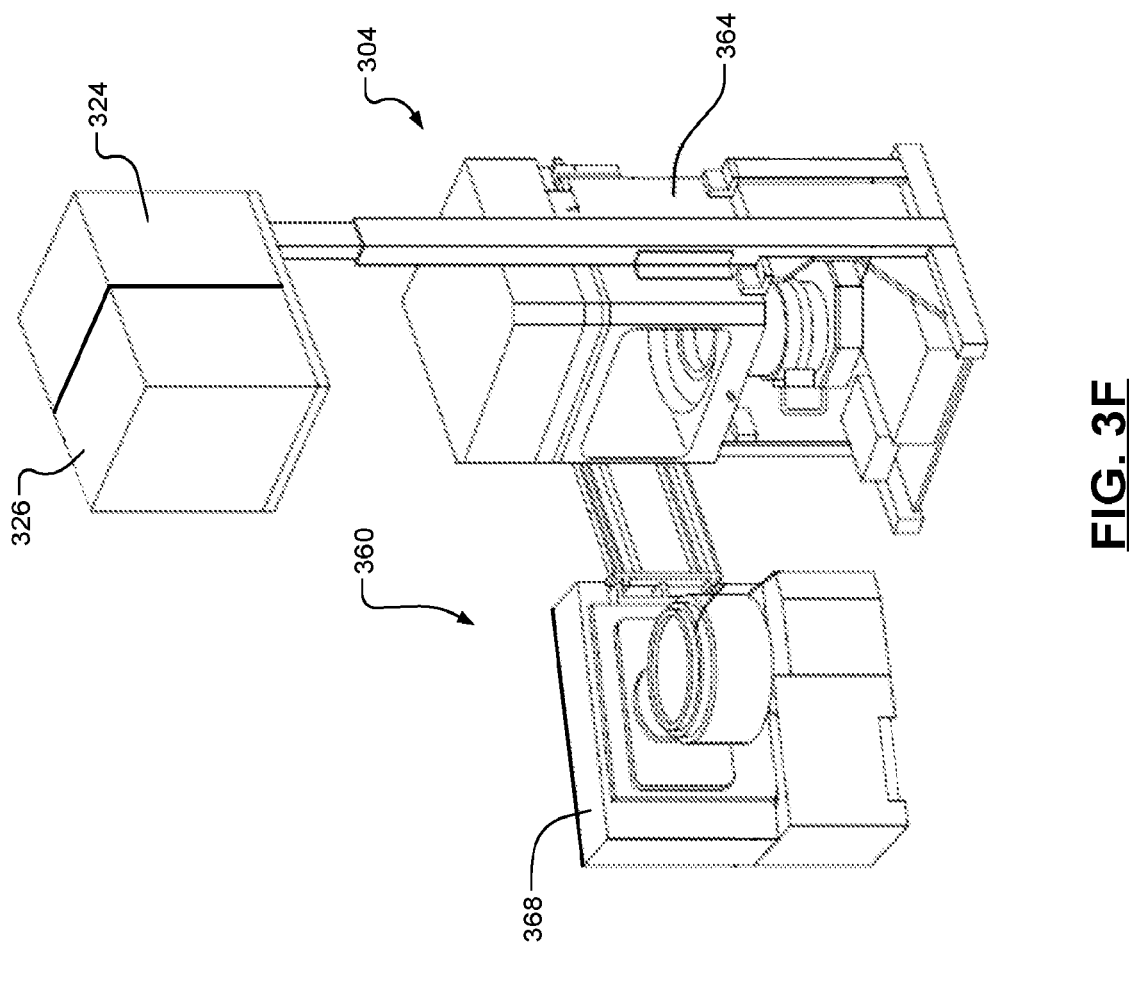
FIG. 3F illustrates the slide and pivot assembly of FIG. 3E in a fully undocked (or fully rotated) state according to the present disclosure.
Figure 3E:
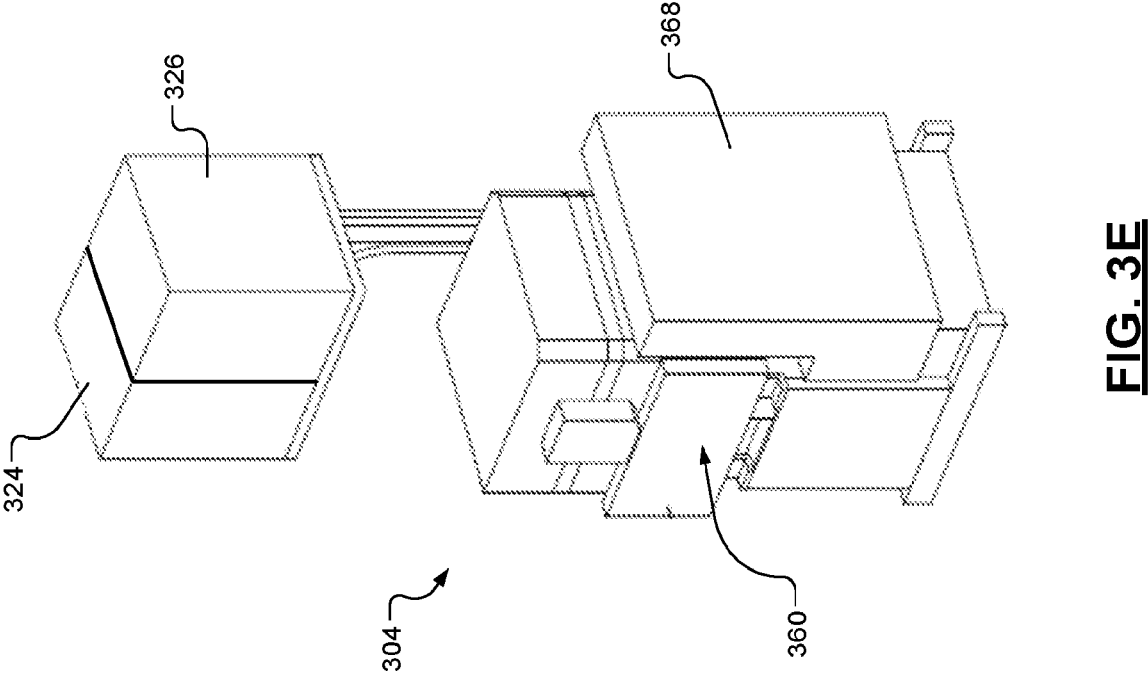
FIG. 3E illustrates a process module including slide and pivot assembly in a fully docked state according to the present disclosure.

In some examples, each of the PMs 304 may include a slide and pivot assembly 360 as shown in FIGS. 3E and 3F. The slide and pivot assembly 360 is connected to a processing chamber 364 and a process module bias assembly 368. The slide and pivot assembly 360 allows the process module bias assembly 368 to be pulled out and away from the processing chamber 364 and pivoted up to a predetermined angle (e.g., 115°) relative to a front face of the processing chamber 364. FIG. 3E shows the slide and pivot assembly 360 in a fully docked state and FIG. 3F shows the slide and pivot assembly 360 in a fully undocked state.

The process module bias assembly 368 includes circuits for supplying RF and/or bias power to electrodes of a substrate support and/or power to heater elements of the substrate support and may include coolant channels for supplying coolant to cool the substrate support. The slide and pivot assembly 360 is attached to a wall of the processing chamber 364 and is configured to hold the weight of the process module bias assembly 368. The slide and pivot assembly 360 is configured to provide a repeatable closed and fully docked position. In this manner, the slide and pivot assembly 360 allows the process module bias assembly 368 to be pulled out and pivoted away from the processing chamber 364 and allows service or maintenance to be performed in the aisle between substrate processing tools 300.

Figure 4A:
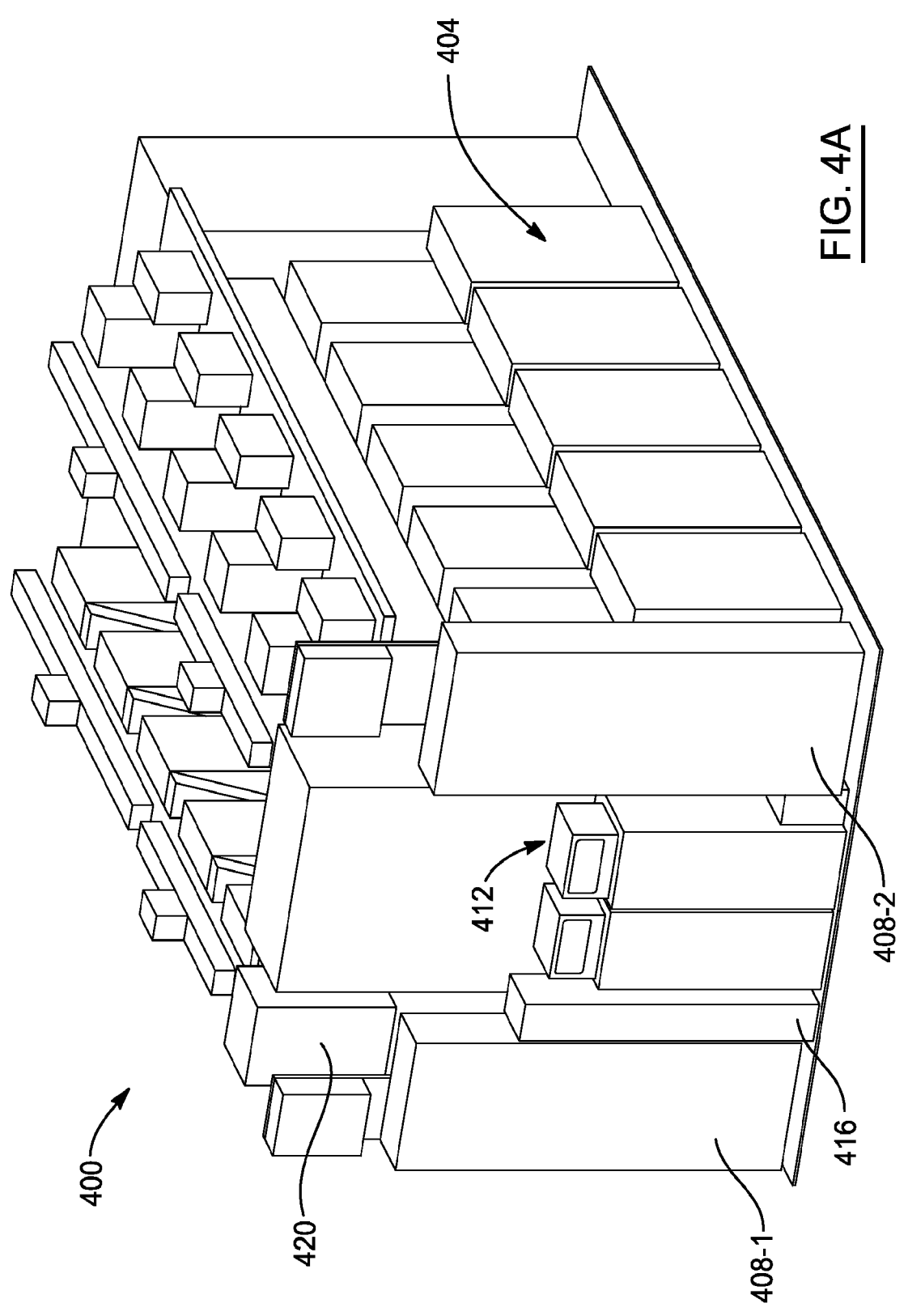
FIGS. 4A and 4B are isometric rear views of an example substrate processing tool according to the present disclosure.
Figure 4B:
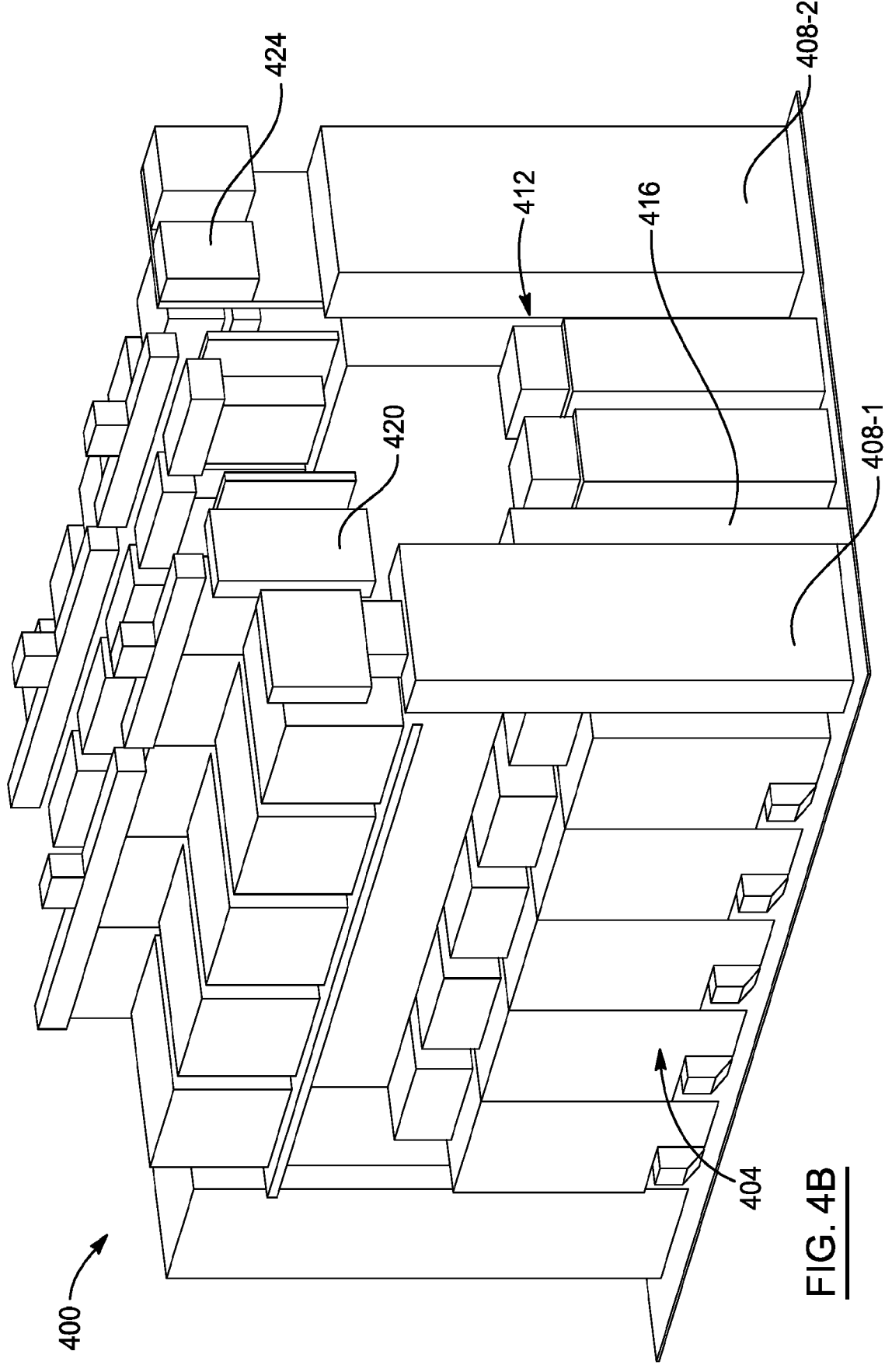

FIGS. 4A and 4B are isometric rear views of an example substrate processing tool 400 according to the present disclosure. In these views, both rows of process modules 404 on respective sides of the substrate processing tool 400 are shown. Power distribution and LOTO assemblies 408 (including power distribution and LOTO assemblies 408-1 for one row of the process modules 404 and power distribution and LOTO assemblies 408-2 for another row of the process modules 404) are arranged on a back end of the substrate processing tool 400. Other components including, but now limited to, one or more strip modules 412, a power module 416 for the strip modules 412, etc. may be arranged on the back end of the substrate processing tool 400.

In some examples, gas distribution for the substrate processing tool 400 may be asymmetric. For example, gas may be supplied to respective rows of the process modules 404 independently. Typically, a facility gas interface box 420 is provided to distribute gases to each row of the process modules 404. For example, the facility gas interface box 420 may be arranged on the back end of the substrate processing tool 400 on a side corresponding to one of the rows of the process modules 404. The substrate processing tool 400 according to the present disclosure may include a second facility gas interface box 424 arranged on a side corresponding to the other of the rows of the process modules 404. Accordingly, each of the facilitate gas interface boxes 420 and 424 is configured to distribute a different group of gases to a respective row of the process modules 404.

Figure 5:
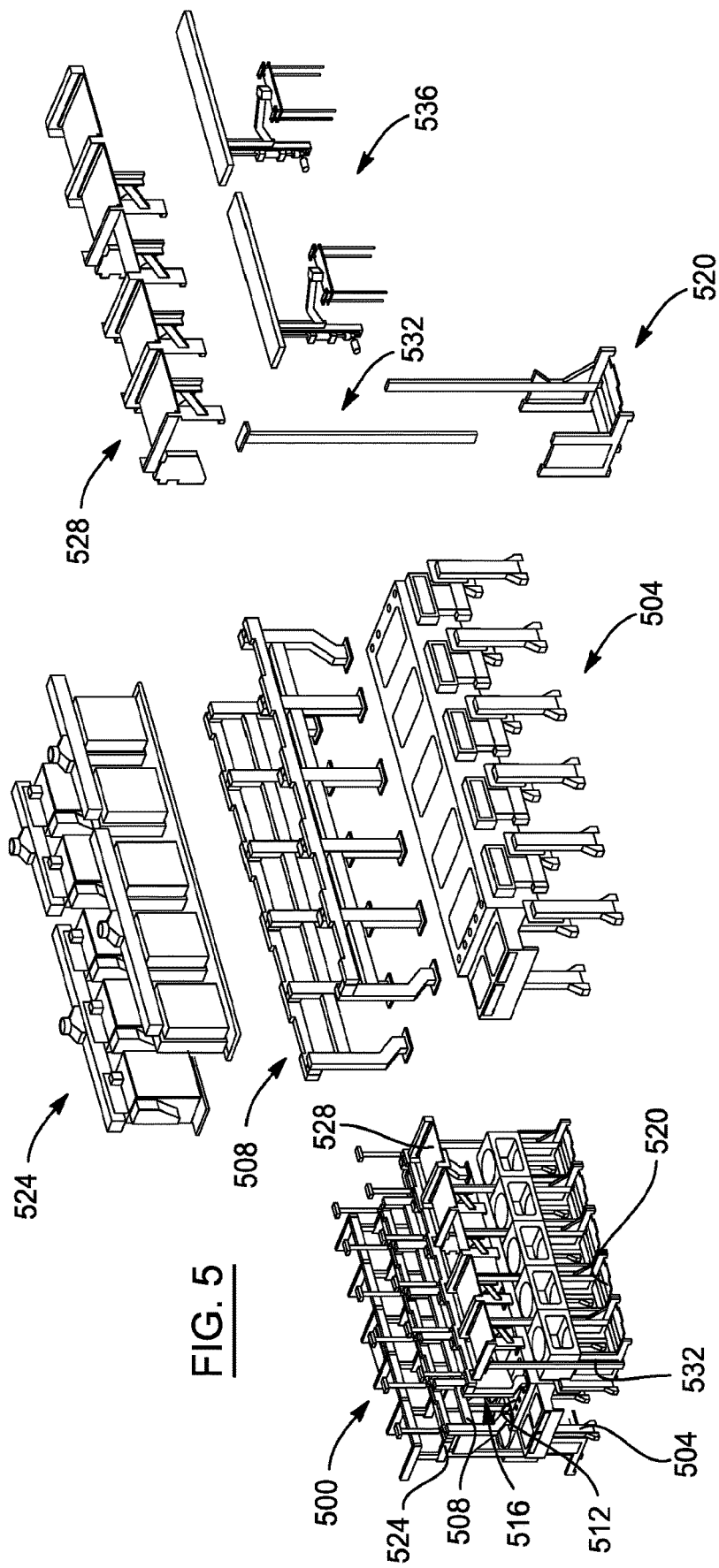
FIG. 5 is an exploded view of an example substrate processing tool frame assembly according to the present disclosure.

FIG. 5 depicts both an assembled view of an example frame assembly 500 as well as an exploded view of an example frame assembly 500 for a substrate processing tool according to the present disclosure. The frame assembly 500 includes various structural components configured to support the VTM, process modules, RF generators, gas boxes, etc. of the substrate processing tool. For example, a VTM frame 504 is configured to support a VTM (e.g., the VTM 348) and an upper frame assembly 508. The upper frame assembly 508 and an upper surface 512 of the VTM frame 504 may define a tunnel 516. In some examples, the tunnel 516 may provide access space for servicing components of the substrate processing tool.

PM frames 520 are arranged below the VTM frame 504. The upper frame assembly 508 supports a gas box frame 524 and an RF support frame 528, which is further supported on RF support frame posts 532. The RF support frame 528 supports hoists 536 configured to lift and lower top plate assemblies of PMs arranged in the PM frames 520 as described above.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing system, comprising:
a vacuum transfer module; and
a plurality of process modules defining respective processing chambers, wherein the plurality of process modules includes a first row of the process modules arranged on a first side of the vacuum transfer module and a second row of the process modules arranged on a second side of the vacuum transfer module opposite the first side,
wherein each of the plurality of process modules includes
a gas box configured to selectively supply at least one gas and/or gas mixture into the processing chamber of the process module, wherein the gas box is arranged above the process module, and
a radio frequency (RF) generator configured to generate RF power to create plasma within the processing chamber, wherein the RF generator is arranged above the process module, wherein the gas box and the RF generator are arranged side-by-side above the process module, wherein the process module has a vertical column footprint defined by an outer perimeter of the process module, and wherein a combined footprint of the gas box and the RF generator arranged side-by-side is within the vertical column footprint of the process module.

2. The substrate processing system of claim 1, wherein the substrate processing system has a linear axis, the first and second rows of the process modules are parallel to and arranged on opposite sides of the linear axis, and the gas box is arranged inward of the RF generator relative to a linear axis of the substrate processing system.

3. The substrate processing system of claim 1, wherein the RF generator is arranged inward of the gas box relative to a linear axis of the substrate processing system.

4. The substrate processing system of claim 1, wherein the first row of the process modules is configured to perform a first process and the second row of the process modules is configured to perform a second process.

5. The substrate processing system of claim 4, wherein the first process is a dielectric etch process and the second process is a conductive etch process.

6. The substrate processing system of claim 4, wherein the first row of the process modules is configured to perform the first process independently of the second row of the process modules performing the second process.

7. The substrate processing system of claim 1 further comprising a power distribution assembly configured to supply power to the first row of the process modules and the second row of the process modules.

8. The substrate processing system of claim 7, wherein the power distribution assembly is configured to supply power to the first row of the process modules independently of supplying power to the second row of the process modules.

9. The substrate processing system of claim 7, wherein the power distribution assembly is arranged on a third side of the vacuum transfer module between the first side and the second side.

10. The substrate processing system of claim 9, further comprising a lock-out/tag-out (LOTO) assembly arranged on the third side of the vacuum transfer module.

11. The substrate processing system of claim 10, further comprising an equipment front end module (EFEM) arranged on a fourth side of the vacuum transfer module opposite the third side.

12. The substrate processing system of claim 1, further comprising a first facility gas interface box configured to distribute gases to the first row of the process modules and a second facility gas interface box configured to distribute gases to the second row of the process modules.

13. The substrate processing system of claim 12, wherein the first facility gas interface box is configured to distribute gases to the first row of the process modules independently of the second facility gas interface box distributing gases to the second row of the process modules.

14. The substrate processing system of claim 1, wherein the first row of the process modules includes five of the process modules and the second row of the process modules includes five of the process modules.

15. The substrate processing system of claim 14, wherein each of the first row and the second row includes two hoists configured to lift and lower respective top plates of at least three of the process modules.

16. The substrate processing system of claim 15, wherein each of the two hoists is configured to lift and lower the respective top plate of a center one of the five process modules.

17. The substrate processing system of claim 1, wherein each of the process modules includes:

a bias assembly comprising power supplies, heaters, and coolant channels; and a slide and pivot assembly attached to a wall of the process module and configured to hold a weight of the bias assembly, to rotate the bias assembly away from the processing chamber, and to pivot the bias assembly up to a predetermined angle relative to a front face of the process module.

* * * * *